United States Patent [19]
Krivokapic

[11] Patent Number: 5,888,873
[45] Date of Patent: Mar. 30, 1999

[54] METHOD OF MANUFACTURING SHORT CHANNEL MOS DEVICES

[75] Inventor: Zoran Krivokapic, Santa Clara, Calif.

[73] Assignee: Advanced Micro Devices, Inc., Sunnyvale, Calif.

[21] Appl. No.: 746,188

[22] Filed: Nov. 6, 1996

[51] Int. Cl.[6] .................................................. H01L 21/336
[52] U.S. Cl. .......................... 438/307; 438/289; 438/298; 438/451
[58] Field of Search .................................... 438/301, 299, 438/306, 307, 289, 290, 291, 297, 298, 439, 449, 451, 448

[56] References Cited

U.S. PATENT DOCUMENTS

| 4,545,110 | 10/1985 | Maas et al. | 438/303 |
| 5,004,701 | 4/1991 | Motokawa | 438/450 |
| 5,114,833 | 5/1992 | Erhardt | 438/146 |
| 5,116,778 | 5/1992 | Haskell et al. | 438/289 |
| 5,151,381 | 9/1992 | Liu et al. | 438/298 |
| 5,212,106 | 5/1993 | Erb et al. | 438/221 |
| 5,306,657 | 4/1994 | Yang | 438/290 |
| 5,395,773 | 3/1995 | Ravindhran et al. | 438/291 |
| 5,576,574 | 11/1996 | Hong | 438/291 |
| 5,614,430 | 3/1997 | Liang et al. | 438/291 |

FOREIGN PATENT DOCUMENTS

| 56-15077 | 2/1981 | Japan . | |
| 4-316333 | 11/1992 | Japan | 438/184 |

*Primary Examiner*—Michael Trinh

[57] ABSTRACT

Short channel MOS semiconductor devices are produced by implanting impurity ions through gate electrode and gate oxide layers, before patterning the gate electrode, using a composite mask of silicon oxide and silicon nitride, to form a shallow channel region in the substrate for adjusting the threshold voltage and a deeper well region for preventing punch through. In another embodiment, impurity ions are implanted to form lightly doped and heavily doped source/drain regions in a single ion implantation step using a thermally grown oxide region having bird's beaks as a mask. Self-aligned lightly doped regions are formed under the bird's beaks.

16 Claims, 3 Drawing Sheets

METHOD OF MANUFACTURING SHORT CHANNEL MOS DEVICES

TECHNICAL FIELD

The present invention relates to metal oxide semiconductor (MOS) transistors, particularly sub-micron complimentary (CMOS) transistors. The present invention has particular applicability to the formation of shallow channel doping and deeper well regions, and the formation of self-aligned lightly and heavily doped source/drain regions.

BACKGROUND ART

The increasing demand for higher densification and miniaturization impose corresponding demands to produce semiconductor devices with design requirements within the sub-micron range. Various types of lightly doped drain (LDD) transistors having shallow junctions and short channel thresholds have evolved in an attempt to satisfy such demands for miniaturization. A conventional structure having a shallow LDD junction is depicted in FIG. 1 and exhibits favorable short channel threshold and drain induced barrier lowering (DIBL) properties. The conventional structure depicted in FIG. 1 comprises substrate 10 with a shallow p-type doping region 12 extending across the gate and a shallow p-type well 14 beneath the shallow doping region 12. The lateral extent of p-type well 14 is not defined as it extends beyond the locality of the depicted transistor and may serve as a common p-type well for several transistors.

With continued reference to FIG. 1, gate oxide 16 is formed on semiconductor surface 10, and gate polysilicon layer 18 is formed on gate oxide 16. LDD regions 20 are typically formed by ion implantation using the gate electrode as a mask for self-alignment. The extension of LDD regions 20 under gate oxide 16 occurs during subsequent thermal diffusion steps. Heavily doped regions 21 are typically formed by ion implantation masked by gate electrode 18 and sidewall spacer 23 which is typically formed by depositing an oxide layer and anisotropically etching to leave a fillet of material on the sidewalls of polysilicon gate electrode 18. The amount of shallow doping 12 is established by the thickness of the gate oxide 18 to achieve a desired channel threshold. The deeper channel doping region 14 is determined by punch-through considerations.

In U.S. Pat. No. 5,116,778, a method is disclosed for producing a CMOS semiconductor device with a shallow channel. The method disclosed in U.S. Pat. No. 5,212,106 departs from the methodology of U.S. Pat. No. 5,116,778 by forming the source/drain region at a controlled distance spaced apart from the shallow channel implant.

There exists a need for efficient, simplified methodology to produce short channel MOS devices, particularly short channel CMOS devices having sub-micron dimensions with increased drive current, improved short channel characteristics and self-aligned lightly doped source/drain regions.

DISCLOSURE OF THE INVENTION

An object of the present invention is a method of forming a short channel MOS device having self-aligned lightly doped source/drain regions adjacent heavily doped source/drain regions.

A further object of the present invention is a method of manufacturing a short channel MOS semiconductor device having improved short channel characteristics and increased drive current.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device having an MOS transistor, which method comprises: forming a first insulating layer on a semiconductor substrate; forming a conductive layer on the first insulating layer; forming a second insulating layer on the conductive layer; forming a third insulating layer on the second insulating layer; patterning the third insulating layer to expose a gate region; heating to form an oxide region in the exposed gate region on the conductive layer, which oxide region comprises a central portion and a bird's beak portion at each end of the central portion, each bird's beak portion tapering away from the central portion in a lateral direction; removing the second and third insulating layers; and implanting impurity ions, using the oxide region as a mask, into the semiconductor substrate to form source/drain regions with a channel region therebetween.

A further aspect of the present invention is a method of manufacturing a semiconductor device having an MOS transistor, which method comprises: forming a first insulating layer on a semiconductor substrate; forming a conductive layer on the first insulating layer; forming a second insulating layer on the conductive layer; forming a third insulating layer on the second insulating layer; patterning the third insulating layer to expose a gate region; implanting impurity ions under the gate region in a channel region to form a first impurity region extending to a first depth into the substrate; and implanting impurity ions under the gate region to form a second impurity region extending to a second depth into the substrate greater than the first depth.

Another aspect of the present invention is a method of manufacturing a semiconductor device having an MOS transistor, which method comprises: forming a first insulating layer on a semiconductor substrate; forming a conductive layer on the first insulating layer; forming a second insulating layer on the conductive layer; forming a third insulating layer on the second insulating layer; patterning the third insulating layer to expose a gate region; implanting impurity ions under the gate region in a channel region to form a first impurity region extending to a first depth into the substrate; and implanting impurity ions under the gate region to form a second impurity region extending to a second depth into the substrate greater than the first depth; heating to form an oxide region in the exposed gate region on the conductive layer, which oxide region comprises a central portion and a bird's beak portion at each end of the central portion, each bird's beak portion tapering away from the central portion in a lateral direction; removing the second and third insulating layers; implanting impurity ions, using the oxide region as a mask, into the semiconductor substrate to form source/drain regions with a channel region therebetween.

A further aspect of the present invention is a method of manufacturing a semiconductor device having an MOS transistor, which method comprises: forming a first insulating layer on a semiconductor substrate; forming a conductive layer on the first insulating layer; forming a second insulating layer on the conductive layer; forming a third insulating layer on the second insulating layer; patterning the third insulating layer to expose a gate region; heating to form an oxide region in the exposed gate region on the conductive layer, which oxide region comprises a central portion and a bird's beak portion at each end of the central portion, each bird's beak portion tapering away from the central portion in a lateral direction; removing the second and third insulating layers; implanting impurity ions, using the oxide region as a mask, into the semiconductor substrate to form source/drain regions with a channel region therebetween in a single ion implantation step.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

MODES FOR CARRYING OUT THE INVENTION

Figure 1:
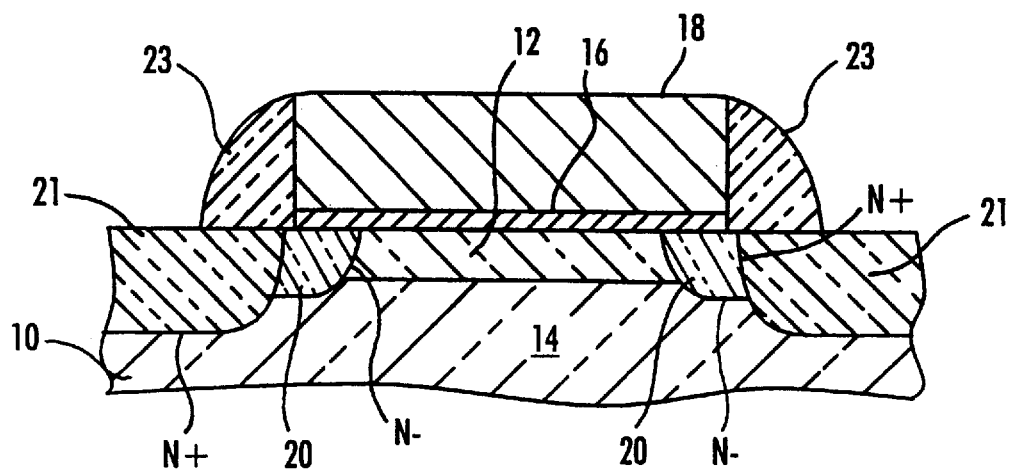
FIG. 1 is a cross-sectional view of a conventional short channel MOS semiconductor device having LDD regions.

The present invention provides efficient, simplified, economic methodology to form short channel MOS devices, particularly short channel CMOS semiconductor devices having sub-micron dimensions and consistently exhibiting improved operating characteristics. Selective channel implants formed in accordance with the present invention significantly increase the drive current. The inventive method also comprises the formation of well regions below the narrow channel implants for improved punch through voltages, even for buried channel devices. In addition, the present method provides a simplified technique for forming self-aligned lightly doped source/drain regions adjacent heavily doped source/drain region in a single impurity implantation step.

Conventional methodology for manufacturing semiconductor devices comprises the formation of isolation regions by a thermal oxidation technique known as LOCOS (local oxidation of silicon) to form a field oxide region which is characterized by a bird's beak portion tapering away from each end of a central portion in a lateral direction. Conventional LOCOS methodology comprises forming a pad or barrier oxide layer on the surface of a semiconductor substrate, forming a nitride layer overlying the pad or barrier oxide layer, and conducting conventional photolithographic and etching techniques to pattern the nitride layer. The exposed portion of the substrate is then oxidized. Bird's beaks are inevitably formed by lateral oxidation under portions of the nitride layer, thereby reducing the size of the active region making it extremely difficult to increase densification and miniaturization. Thus, bird's beaks are undesirable from a miniaturization standpoint; however, they provide stress relief transition regions which prevent damage to the semiconductor substrate during field oxide formation. A method of forming field oxide regions is disclosed in U.S. Pat. No. 5,151,381.

The present invention comprises the formation of a conventional thermal oxide region by a LOCOS technique but not for the isolation of active regions. Rather, in accordance with the present invention, a thermal oxide region with bird's beaks is formed to serve as a mask during impurity ion implantation to simultaneously form source/drain regions having both lightly and heavily doped regions in a single impurity implantation step, with the lightly doped regions self-aligned under the bird's beak portions.

In another aspect of the present invention, pad oxide and nitride layers are formed and patterned on a gate electrode layer to expose a gate region. Impurity ion implantation is then conducted through the exposed portion of the gate electrode layer and gate oxide to form narrow channel and deep well regions in the underlying channel region in the semiconductor substrate. Such a selected channel implant significantly increases the drive current, and the deeper well region effectively improves the short channel characteristics by preventing punch through even for buried channel devices.

FIGS. 2 through 6 illustrate sequential methodology in accordance with the present invention wherein similar elements bear similar reference numerals. Adverting to FIG. 2, a first insulating layer or gate oxide layer 21 is formed on semiconductor substrate 20. Gate oxide layer 21 is typically formed at a thickness of about 50 Å to about 150 Å by conventional techniques, such as thermal oxidation. Conductive layer 22, such as polysilicon, is then deposited on gate oxide 21. Polysilicon layer 22 is typically deposited at a thickness of about 2000 Å to about 2500 Å and will ultimately serve as the gate electrode for MOS transistors.

Figure 2:
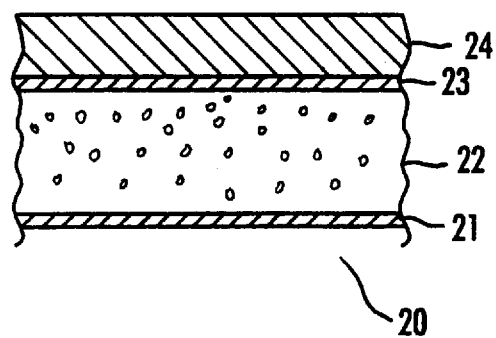
FIGS. 2 through 6 schematically illustrate sequential phases of a method in accordance with the present invention.

With continuing reference to FIG. 2, a second insulating layer 23, such as silicon dioxide, is formed on polysilicon layer 22. Silicon dioxide layer 23 is typically deposited at a thickness of about 100 Å to about 400 Å. A third insulating layer 24, such as silicon nitride ($Si_3N_4$), is formed on silicon dioxide layer 23. $Si_3N_4$ layer 24 is typically deposited at a thickness of about 1000 Å to about 1500 Å.

Figure 3:
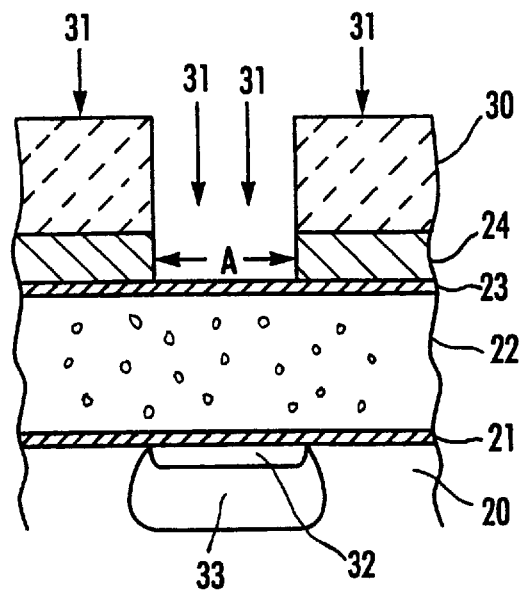

A photoresist layer is then deposited on silicon nitride layer 24 and, employing conventional photolithographic techniques, patterned to form photoresist mask 30, as shown in FIG. 3. Silicon nitride layer 24 is then etched, using photoresist mask 30, by conventional anisotropic etching techniques to expose a gate region A under which a channel region for an MOS transistor will be formed. In the embodiment depicted in FIG. 3, silicon nitride layer 24 is etched leaving silicon dioxide layer 23. However, in accordance with the present invention, isotropic etching can also be conducted to remove silicon dioxide layer 23. One having ordinary skill in the art would appreciate that a native oxide will normally form on polysilicon layer 22.

With continuing reference to FIG. 3, an embodiment of the present invention comprises implanting impurity ions, as depicted by arrows 31, through the exposed gate region A, including polysilicon layer 24 and gate oxide 23, to selectively form a first ion implanted impurity region 32 in semiconductor substrate 20. First impurity region 32 constitutes a shallow channel doping region for adjusting the threshold voltage. The accurately formed hard mask comprising silicon nitride layer 24 accurately defines a region in which the shallow channel doping region is formed in the semiconductor substrate. Subsequently, a second impurity or well region 33 of the same conductivity type as the first impurity region is implanted in the semiconductor substrate and extends to a depth greater than that of the first impurity or shallow channel doping region. As is known in the art, well region 33 prevents punch through. The formation of second impurity region 33 after formation of gate oxide layer 21 improves the short channel characteristics, particularly for p-channel semiconductor devices wherein punch through voltages are prevented even for buried channel devices.

In practicing the present invention, one having ordinary skill in the art can easily determine the optimum ion implantation conditions for implanting the first 32 and second 33 impurity regions in semiconductor substrate 20. For example, it has been found that when manufacturing a CMOS semiconductor device, boron can suitably be implanted in the channel region of an n-channel MOS device at an implantation energy of about 100 kev to about 200 kev to form a first impurity region, for adjusting the threshold voltage, having a concentration of about $0.5 \times 10^{11}$ to about $2 \times 10^{12}$ atoms/cm$^2$, and at an implantation energy of about 270 kev to about 400 kev to form a second impurity region, for preventing punch through, having a concentration of about $1 \times 10^{12}$ to about $5 \times 10^{12}$ atoms/cm$^2$. It has also been found that phosphorous or arsenic can suitably be implanted in the channel region of a p-channel MOS device at an implantation energy of about 150 kev to about 400 kev to form a first impurity region, for adjusting the threshold voltage, having a concentration of about $5 \times 10^{11}$ to about $2 \times 10^{12}$ atoms/cm$^2$, and at an implantation energy of about 750 kev to about 1000 kev to form a second impurity region, for preventing punch through, having a concentration of about $1 \times 10^{12}$ to about $5 \times 10^{12}$ atoms/cm$^2$.

Figure 4:
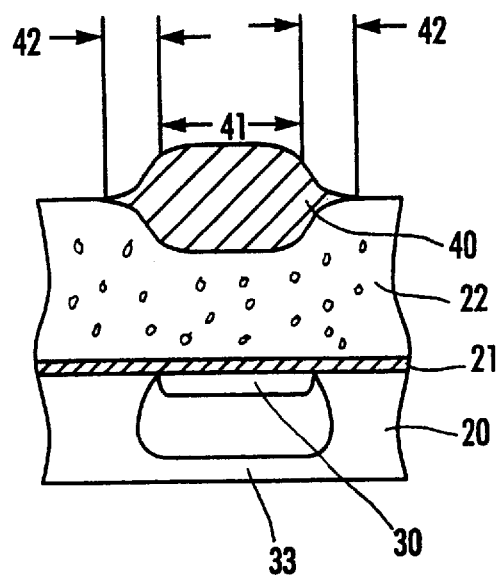

In accordance with another embodiment of the present invention, self-aligned source/drain regions comprising lightly and heavily doped regions are formed using a mask comprising a thermal oxide region formed by LOCOS. This embodiment of the present invention can be practiced subsequent to the stage schematically illustrated in FIG. 3 by conducting wet oxidation to form thermal oxide region 40, as shown in FIG. 4, which is similar to a field oxide region conventional employed for isolating active regions. Thermal oxide region 40 comprises a central portion 41 having substantially uniform thickness, typically of about 75 nm to about 125 nm. A bird's beak portion 42 is formed of each end of central region 41, as in a conventional field oxide region. Thermal oxide region 40 can be formed at a temperature as in conventional LOCOS techniques, such as at about 850° C. to about 900° C., for about 60 to about 90 minutes. After formation of thermal oxide region 40, silicon nitride layer 24 is removed along with silicon dioxide layer 23 if the latter was not removed by etching when exposing gate region A.

Figure 5:
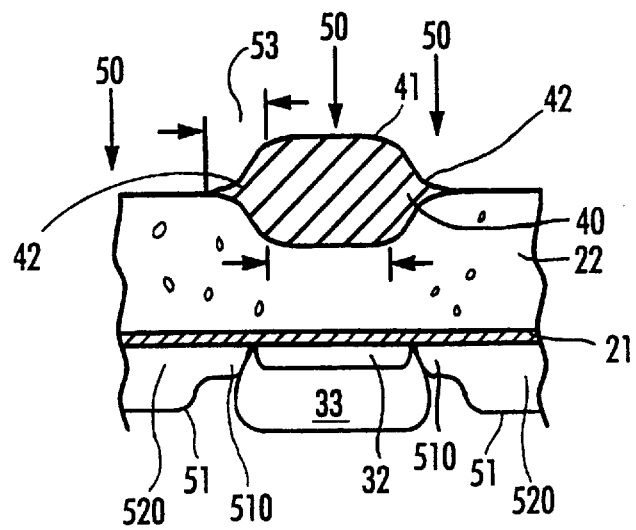

Thermal oxide region 40, with bird's beak portions 42, serves as a mask for forming source/drain regions having lightly doped and heavily doped regions in a single implantation step. As depicted in FIG. 5, impurity ion implantation is conducted, as shown by arrows 50, to simultaneously form, in a single step, source/drain regions 51 each having a lightly doped region 510 and a heavily doped region 520. Each lightly doped region 510 is self-aligned under a bird's beak portion 42 of thermal oxide region 40. The relatively thicker central portion 41 of thermal oxide region 40 prevents implantation into the first and second impurity regions 32 and 33 formed in the channel region. Typically, each bird's beak region tapers from the end of the central portion 41 in a lateral direction for about 0.15 µm. However, the length of the bird's beak portion 53, as shown in FIG. 5, can be adjusted by adjusting the relative thickness of the silicon nitride layer 24, silicon dioxide layer 23, oxidation temperature and oxidizing ambient.

In practicing the present invention, one having ordinary skill in the art can select appropriate impurities and implantation conditions to form source/drain regions for CMOS devices. For example, in forming the source/drain regions for an n-channel MOS device, it has been found that arsenic can suitably be implanted at an implantation energy of about 500 kev to about 700 kev, with resulting heavily doped regions 520 having a concentration of about $5 \times 10^{15}$ to about $8 \times 10^{15}$ atoms/cm$^2$. The concentration of the lightly doped regions 510 is less due to the masking provided by bird's beak portions 42. In forming the source/drain regions for a p-channel MOS device, it has been found that boron can suitably be implanted at an implantation energy of about 150 kev to about 200 kev, with resulting heavily doped regions 520 having a concentration of about $5 \times 10^{15}$ to about $8 \times 10^{15}$ atoms/cm$^2$, with a lower concentration in the lightly doped regions 510 due to masking by bird's beak portions 42.

Figure 6:
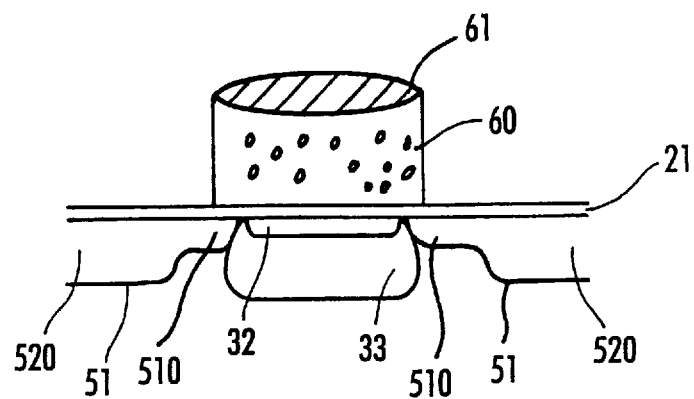

Subsequently, as shown in FIG. 6, polysilicon gate electrode layer 22 is patterned and etched employing conventional techniques to form gate electrode 60 having a remaining portion 61 of thermal oxide region 40 thereon. Subsequent processing is conducted in accordance with conventional practices.

Thus, the present invention provides elegantly simplified, efficient, economic methodology to form short channel CMOS semiconductor devices having an improved shallow channel implant for adjusting the threshold voltage and an effective impurity well for preventing punch through. Improved prevention to punch through, even in p-channel devices having buried channel devices, is achieved, and the selective channel implant significantly increases drive current. The present invention also enables the formation of self-aligned source/drain regions, including self-aligned lightly doped and heavily doped regions, in a single ion implantation step without the necessity of thermally diffusing impurity ions under the gate electrode.

As in conventional practices, a two channel mask can be employed, i.e., a single mask for forming the first and second impurity regions for n-channel and p-channel MOS transistors of a CMOS device. The present invention is not limited to the particular materials exemplified herein, but can be practiced employing an conventional insulating and conductive materials generally employed from manufacturing semiconductor devices. Such insulating materials and conductive materials can be deposited by any conventional deposition technique generally employed in manufactured semiconductor devices.

The present invention provides the advantages of selective channel doping which significantly increases the drive current. The formation of a punch through well region implant after formation of the gate oxide results in improved short channel effects. The use of a silicon nitride mask provides additional processing advantages, in that photolithographic techniques for processing a nitride layer are simpler and easier to control than for a polysilicon layer. During etching of the polysilicon layer, the gate oxide region is advantageously protected from damage by a thick LOCOS oxide, thereby maintaining the designed dimensional integrity of the gate oxide. In accordance with the present invention, all implants are self-aligned and there is no need for separate LDD implants, since the bird's beaks enables the formation of self-aligned LDD regions. The present invention is applicable to any of various types of semiconductor devices, but has particular applicability to short channel MOS devices, particularly short channel CMOS devices.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

I claim:

1. A method of manufacturing a semiconductor device having an MOS transistor, which method comprises:

forming a first insulating layer on a semiconductor substrate;

forming a conductive layer on the first insulating layer;

forming a second insulating layer on the conductive layer;

forming a third insulating layer directly on the second insulating layer;

patterning the third insulating layer to expose a gate region;

heating to form an oxide region in the exposed gate region on the conductive layer, which oxide region comprises a central portion and a bird's, beak portion at each end of the central portion, each bird's beak portion tapering away from the central portion in a lateral direction;

removing the second and third insulating layers;

implanting impurity ions, using the oxide region as a mask, into the semiconductor substrate to form lightly and heavily doped source and drain regions with a channel region therebetween, whereby the lightly doped source and drain regions are formed in a self-aligned manner under each bird's beak region and the heavily doped source and drain regions are formed adjacent the lightly doped source and drain regions, respectively; and after implanting the impurity ions, patterning the conductive layer by etching to form a gate electrode over the channel region.

2. The method according to claim 1, wherein the semiconductor device comprises CMOS transistors, which method further comprises:

forming the source and drain regions for an n-channel MOS device by implanting arsenic at an implantation energy of about 500 kev to about 700 kev, wherein the heavily doped regions have a concentration of about $5 \times 10^{15}$ to about $8 \times 10^{15}$ atoms/cm$^2$; and forming the source and drain regions for a p-channel MOS device by implanting boron at an implantation energy of about 150 kev to about 200 kev, wherein the resulting heavily doped region has a concentration of about $5 \times 10^5$ to about $8 \times 10^{15}$ atoms/cm$^2$.

3. The method according to claim 1, further comprising, after patterning the third insulating layer and before heating:

implanting impurity ions under the gate region in a s channel region to form a first impurity region extending to a first depth into the substrate; and implanting impurity ions under the gate region to form a second impurity region extending to a second depth into the substrate greater than the first depth.

4. The method according to claim 3, wherein:

the first impurity region is a shallow channel region for adjusting the threshold voltage of the transistor; and the second impurity region is a well region for preventing punch through.

5. The method according to claim 1, wherein:

the first insulating layer is a gate oxide layer;

the second insulating layer comprises silicon oxide; and the third insulating layer comprises silicon nitride.

6. The method according to claim 5, wherein:

the gate oxide has a thickness of about 50 Å to about 150 Å;

the second insulating layer has a thickness of about 100 Å to about 400 Å;

and the third insulating layer has a thickness of about 100 Å to about 1500 Å.

7. The method according to claim 1, comprising patterning by etching to remove a portion of the third insulating layer, leaving the second insulating layer exposed on the conductive layer.

8. The method according to claim 1, comprising patterning by etching to remove a portion of the second and third insulating layers to expose a portion of the conductive layer.

9. The method according to claim 3, wherein the semiconductor device comprises CMOS transistors, which method further comprises:

implanting boron at an implantation energy of about 100 kev to about 200 kev to form said first impurity region, having a concentration of about $0.5 \times 10^{11}$ to about $2 \times 10^{12}$ atoms/cm$^2$, in the channel region of an n-channel MOS transistor;

implanting boron at an implantation energy of about 270 kev to about 400 kev to form said second impurity region in the channel region having a concentration of about $1 \times 10^{12}$ to about $5 \times 10^{12}$ atoms/cm$^2$, of the n-channel MOS transistor;

implanting phosphorous or arsenic at an implantation energy of about 150 kev to about 400 kev to form said first impurity region, having a concentration of about $5 \times 10^{11}$ to about $2 \times 10^{12}$ atoms/cm$^2$, in the channel region of a p-channel CMOS transistor; and implanting arsenic or phosphorous at an implantation energy of about 750 kev to about 1000 kev to form said second impurity region having a concentration of about $1 \times 10^{12}$ to about $5 \times 10^{12}$ atoms/cm$^2$, in the channel region of the p-channel MOS transistor.

10. The method according to claim 1, comprising heating at a temperature of about 850° C. to about 900° C., for about 60 to about 90 minutes, to form the oxide region having a central portion with a substantially constant thickness of about 75 nm to about 125 nm.

11. The method according to claim 1, wherein the lightly and heavily doped source and drain regions are formed during a single ion implantation step.

12. The method according to claim 1, wherein the semiconductor device comprises CMOS transistors, which method further comprises implanting impurity ions to form lightly and heavily doped n-source and drain regions in a single implantation step; and implanting impurity ions to form lightly and heavily doped p-source and drain regions in a single ion implantation step.

13. A method of manufacturing a semiconductor device having a MOS transistor, which method comprises:

forming a first insulating layer on a semiconductor substrate;

forming a conductive layer on the first insulating layer;

forming a second insulating layer on the conductive layer;

forming a third insulating layer directly on the second insulating layer;

patterning the third insulating layer to expose a gate region;

implanting impurity ions under the gate region in a channel region to form a first impurity region extending to a first depth into the substrate;

implanting impurity ions under the gate region to form a second impurity region of the same conductivity type as the first impurity region extending to a second depth into the substrate greater than the first depths;

implanting impurities of the opposite conductivity type as the first impurity region to form source/drain regions; and etching the conductive layer to form a gate electrode after forming the source/drain regions.

14. The method according to claim 13, wherein:

the first impurity region is a shallow channel region for adjusting the threshold voltage of the transistor; and the second impurity region is a well region for preventing punch through.

15. The method according to claim 14, wherein the semiconductor device comprises CMOS transistors, which method further comprises:

implanting boron at an implantation energy of about 100 kev to about 200 kev to form said first impurity region, having a concentration of about $0.5 \times 10^{11}$ to about $2 \times 10^{12}$ atoms/cm$^2$, in the channel region of an n-channel MOS transistor;

implanting boron at an implantation energy of about 270 kev to about 400 kev to form said second impurity region in the channel region having a concentration of about $1 \times 10^{12}$ to about $5 \times 10^{12}$ atoms/cm$^2$, of the n-channel MOS transistor;

implanting phosphorous or arsenic at an implantation energy of about 150 kev to about 400 kev to form said first impurity region, having a concentration of about $5 \times 10^{11}$ to about $2 \times 10^{12}$ atoms/cm$^2$, in the channel region of a p-channel CMOS transistor; and implanting arsenic or phosphorous at an implantation energy of about 750 kev to about 1000 kev to form said second impurity region having a concentration of about $1 \times 10^{12}$ to about $5 \times 10^{12}$ atoms/cm$^2$ in the channel region of the p-channel MOS transistor.

16. The method according to claim 13, wherein: the second insulating layer comprises silicon oxide; and the third insulating layer comprises silicon nitride.

* * * * *

UNITED STATES PATENT AND TRADEMARK OFFICE
CERTIFICATE OF CORRECTION

PATENT NO. : 5,888,873
DATED : March 30, 1999
INVENTOR(S) : Zoran KRIVOKAPIC

It is certified that error appears in the above-identified patent and that said Letters Patent is hereby corrected as shown below:

In the Claims,

Col. 7, Claim 3, Line 52, after "region in a", delete "s"

Col. 9, Claim 13, Line 4, change "depths" to -- depth --.

Signed and Sealed this

Ninth Day of November, 1999

Attest:

Attesting Officer

Q. TODD DICKINSON

Acting Commissioner of Patents and Trademarks